US009880208B2

(12) United States Patent
Templ

(10) Patent No.: US 9,880,208 B2
(45) Date of Patent: Jan. 30, 2018

(54) METHOD, A DEVICE, A SYSTEM, A COMPUTER PROGRAM AND A COMPUTER PROGRAM PRODUCT FOR DETERMINING INFORMATION ABOUT EFFICIENCY OF AN INDUCTIVE CHARGING SYSTEM, HAVING A PRIMARY COIL EMBEDDED IN A ROAD INFRASTRUCTURE

(71) Applicant: Alcatel Lucent, Boulogne Billancourt (FR)

(72) Inventor: Wolfgang Templ, Sersheim (DE)

(73) Assignee: Alcatel Lucent, Boulogne-Billancourt (FR)

(*) Notice: Subject to any disclaimer, the term of this patent is extended or adjusted under 35 U.S.C. 154(b) by 780 days.

(21) Appl. No.: 14/364,261

(22) PCT Filed: Dec. 5, 2012

(86) PCT No.: PCT/EP2012/074480
§ 371 (c)(1),
(2) Date: Jun. 10, 2014

(87) PCT Pub. No.: WO2013/104466
PCT Pub. Date: Jul. 18, 2013

(65) Prior Publication Data
US 2014/0372077 A1 Dec. 18, 2014

(30) Foreign Application Priority Data
Jan. 9, 2012 (EP) .................................... 12305022

(51) Int. Cl.
*G01R 21/133* (2006.01)
*B60L 5/00* (2006.01)
(Continued)

(52) U.S. Cl.
CPC ............ *G01R 21/133* (2013.01); *B60L 5/005* (2013.01); *B60L 11/182* (2013.01); *B60M 7/003* (2013.01);
(Continued)

(58) Field of Classification Search
CPC ...... G01R 21/133; B60L 5/005; B60L 11/182; B60M 7/003; H04B 5/0037;
(Continued)

(56) References Cited

U.S. PATENT DOCUMENTS

2007/0131505 A1* 6/2007 Kim .................... B60L 5/005
191/14
2009/0045773 A1* 2/2009 Pandya ................ B60L 5/005
320/108
2014/0103871 A1* 4/2014 Maikawa .............. H02J 7/025
320/108

FOREIGN PATENT DOCUMENTS

CN 101252293 8/2008
JP 2001060218 3/2001
(Continued)

OTHER PUBLICATIONS

Sugii, Y. et al; Calculation Method of New Traffic System with Inductive Electrical Supply; IEEJ Transactions on Industry Applications, Japan, The institute of Electrical Engineers, Nov. 2000, T.IEE Japan; vol. 120-D, No. 11, pp. 1295-1304.
(Continued)

*Primary Examiner* — Manuel L Barbee
(74) *Attorney, Agent, or Firm* — Patti & Malvone Law Group LLC

(57) ABSTRACT

A technique is provided for determining information about efficiency of an inductive charging system having a primary coil embedded in a road infrastructure and a secondary coil located in a vehicle moving on the road infrastructure. A first inductive coupling efficiency component attributed to the
(Continued)

road infrastructure is determined from a total efficiency depending on a second inductive coupling efficiency component attributed to a position of the secondary coil relative to the primary coil and of a third inductive coupling efficiency component attributed to an electric circuit comprising the secondary coil.

11 Claims, 4 Drawing Sheets

(51) Int. Cl.
    *B60L 11/18*     (2006.01)
    *B60M 7/00*     (2006.01)
    *H04B 5/00*     (2006.01)
    *H02J 5/00*     (2016.01)

(52) U.S. Cl.
    CPC ......... *H04B 5/0037* (2013.01); *H04B 5/0093* (2013.01); *H02J 5/005* (2013.01); *H04B 5/0062* (2013.01); *Y02T 10/7005* (2013.01); *Y02T 10/7072* (2013.01); *Y02T 90/122* (2013.01); *Y02T 90/14* (2013.01)

(58) Field of Classification Search
    CPC ..... H04B 5/0093; H04B 5/0062; H02J 5/005; Y02T 10/7005; Y02T 10/7072; Y02T 90/122; Y02T 90/14
See application file for complete search history.

(56) References Cited

FOREIGN PATENT DOCUMENTS

| | | |
|---|---|---|
| JP | 2006340541 | 12/2006 |
| JP | 2009148493 | 7/2009 |
| JP | 2010187471 | 8/2010 |
| JP | 2010239690 | 10/2010 |
| KR | 20110041307 | 4/2011 |
| WO | 2011125632 | 10/2011 |

OTHER PUBLICATIONS

Dipl. Ing. Dr. Peter Frohling; Grundlagen der Elektrotechnik; HTL Modling; Dec. 1, 2011; pp. 1-107; XP002679698; Retrieved from the Internet: URL:http://htl.moedling.at/uploads/media/Grundlagen_der_ET_02.pdf; [retrieved on Jul. 11, 2012].

* cited by examiner

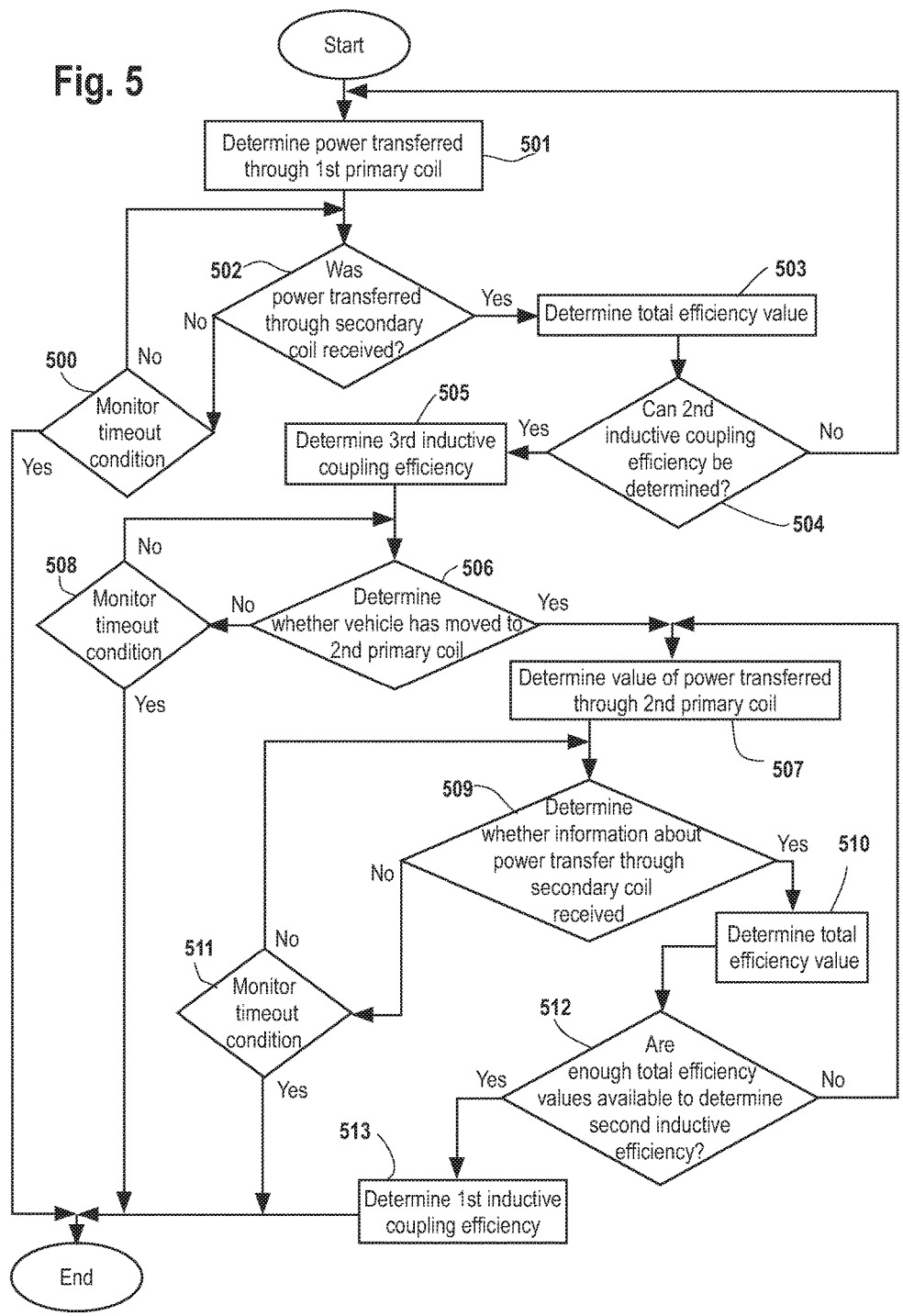

METHOD, A DEVICE, A SYSTEM, A COMPUTER PROGRAM AND A COMPUTER PROGRAM PRODUCT FOR DETERMINING INFORMATION ABOUT EFFICIENCY OF AN INDUCTIVE CHARGING SYSTEM, HAVING A PRIMARY COIL EMBEDDED IN A ROAD INFRASTRUCTURE

FIELD OF THE INVENTION

The invention is based on a priority application EP12305022.1 which is hereby incorporated by reference.

The invention relates to a method, a device, a system, a computer program and a computer program product for determining information about efficiency of an inductive charging system, having a primary coil embedded in a road infrastructure.

BACKGROUND

Dynamical inductive charging systems for electric vehicles are an option for future electric mobility concepts and worldwide subject of a high number of research activities and pilot projects. Principally, those systems consist of an electrified road featuring a number of individual sequential "primary" coils for power transmission under the road surface and a secondary "pickup" coil mounted under the floor of the electric vehicle. The coils in the road are connected to a charging infrastructure which activates the coil element under the moving vehicle as soon as both coils are optimally positioned, such creating a nearly static configuration from the vehicle point of view. Optimally in this context means for example, that the position is the position at that one of the coils is penetrated entirely by the electromagnetic field generated by other of the coils, or at which both coils are in the position where the electromagnetic coupling has a maximum value. Due to road construction or vehicle configuration, the coils may also be activated when they are less than optimally positioned, e.g. whenever they are in a position allowing any electromagnetic coupling.

In order to optimize control of charging, to monitor the performance of the infrastructure or to monitor the performance of the vehicle's charging system, differentiation between primary side and secondary side originated efficiency during power transmission is desirable.

A simple measurement of transmitted and received power however only reveals the mathematical product of vehicle originated efficiency, infrastructure originated efficiency and an efficiency value due to power loss originating from a lateral displacement of the pickup coil and the primary coil. There is no way to differentiate the individual power loss contributions from this measurement.

Therefore, to determine the individual efficiencies, the efficiency of individual vehicles needs to be measured using a calibrated test environment, for example a calibration road. Efficiency of the road infrastructure also needs to be derived from measurements using a calibrated vehicle and a calibrated test track. To characterize the effect of lateral misalignment of primary and secondary coils, predefined passes or trajectories have to be driven with the vehicle on the calibration test track.

This method involves high effort, is costly and does not allow for continuous monitoring of the road infrastructure and the electric vehicles.

SUMMARY

The object of the invention is thus to provide a cheap and reliable method to provide information about the individual efficiency terms in a real world environment.

The main idea of the invention is thus to determine information about efficiency of an inductive charging system having a primary coil, in particular embedded in a road infrastructure, wherein a first inductive coupling efficiency component, attributed to a road infrastructure, in particular comprising said primary coil, is determined from a total efficiency, depending on a second inductive coupling efficiency component, attributed to a position of a secondary coil, relative to said primary coil, and of a third inductive coupling efficiency component, attributed to an electric circuit, comprising said secondary coil. This way the coupling efficiency attributed to the road infrastructure and in particular comprising said primary coil is determined easily.

Advantageously, when counted along driving direction, said inductive charging system, in particular said road infrastructure, comprises a first primary coil, wherein said third inductive coupling efficiency component is determined from a first value of said total efficiency, determined when an electromagnetic field generated by one of said first primary coil or said secondary coil penetrates the other coil at least partially, in particular when said secondary coil and said first primary coil overlap at least partially e.g. perpendicular to an axle connecting the center of the individual coils, and a predetermined first value of said first inductive coupling efficiency component, attributed to said road infrastructure at the location of said first primary coil. The third inductive coupling efficiency component attributed to said electric circuit comprising said secondary coil may be read from storage or received via a data link. This way, only said first value of the efficiency has to be predetermined and all other values can be determined easily without having to calibrate each of the primary coils of the whole road comprising the charging system beforehand individually.

Advantageously, said road infrastructure comprises a second primary coil wherein a second value of said first inductive coupling efficiency component, attributed to said road infrastructure at the location of said second primary coil, is determined from a second value of said total efficiency, determined when an electromagnetic field generated by one of said second primary coil or said secondary coil penetrates the other coil, in particular when said secondary coil and said second primary coil overlap at least partially e.g. perpendicular to an axle connecting the center of the individual coils. This way, consecutive efficiency values for consecutive sections of the road, containing the charging system are determined easily.

Advantageously, said method comprises the steps of determining said second inductive coupling efficiency component in particular from the geometry of said first coil, as a function of a position relative to the location of said first primary coil, storing at least one pair of values of location and respective second inductive coupling efficiency component, in particular in a characteristic curve and determining said second inductive coupling efficiency component from storage, thus enabling the determination of inductive coupling efficiency contribution based on the stored characteristic, in particular by extrapolation or interpolation of said pair of values of said characteristic curve. This provides an easy method to calculate the efficiency terms.

Advantageously, said total efficiency is determined depending on measured information about a first power transfer through said primary coil and measured information about a second power transfer through said secondary coil. This way, information about the total efficiency is gained easily from measured values.

Advantageously, said information about the power transfer is determined from measurements taken at essentially the same time. This way, matching power transfer values are used to determine a more accurate efficiency value.

Advantageously, said method comprises the steps of determining at least two values of said total efficiency, in particular a characteristic curve, while said secondary coil is passing a trajectory over said primary coil (101, 112), e.g. at least partially overlapping with said primary coil, in particular when movement of said secondary coil, relative to said primary coil, is detected and determining said second inductive coupling efficiency component depending on said at least two values of said total efficiency, in particular from a shape of said characteristic curve. This way, the efficiency term attributed to the relative location of said primary coil and said secondary coil are easily determined from the total efficiency values.

Advantageously said primary coil is mounted near said road infrastructure in a way that an electromagnetic field generated by said primary coil penetrates a predetermined area above said road infrastructure.

Further developments of the invention can be gathered from dependent claims and the following description.

BRIEF DESCRIPTION OF THE FIGURES

In the following the invention will be explained further, making reference to the attached drawings.

FIG. 5 schematically shows a flowchart of a part of the inventive method.

DESCRIPTION OF THE EMBODIMENTS

Figure 1:
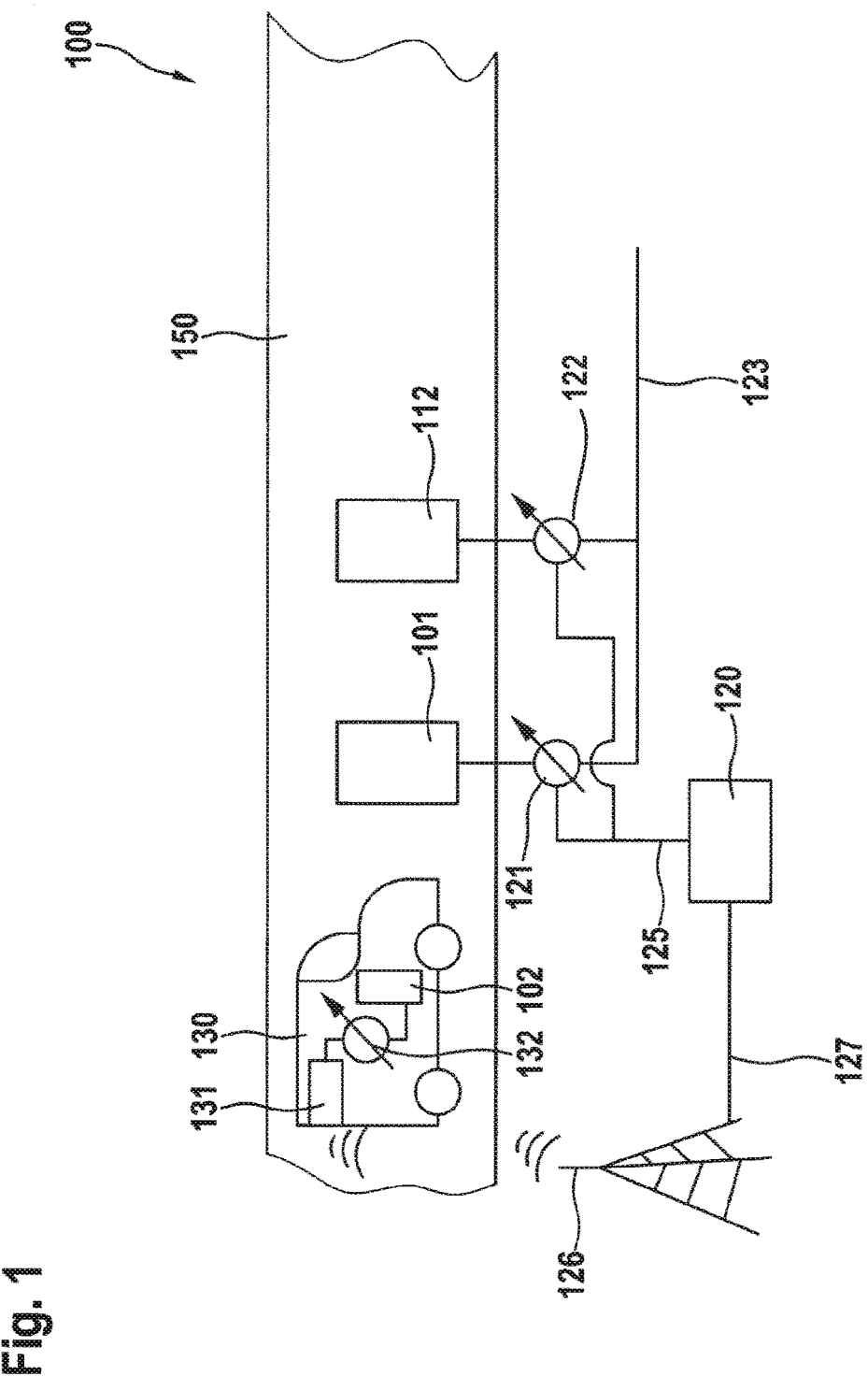
FIG. 1 schematically shows a first part of a road infrastructure.

FIG. 1 shows a first part of a road infrastructure 100, comprising a first primary coil 101 and a second primary coil 112. Said first primary coil 101 is attached to a power supply, for example a power grid via a first power meter 121 and a power line 123. Said second primary coil 112 is attached to said power supply via a second power meter 122 and said power line 123. Said first power meter 121 is adapted to measure electrical power that is transferred through said first primary coil 101. Said second power meter 122 is adapted to measure electrical power, transferred through said second primary coil 112. Said power meters 121 and 122 are connected to a device 120 via a data link 125. Said device 120 is connected via a data link 127 to an antenna 126.

Alternatively to using said second power meter 122 said second primary coil 112 may be attached to said first power meter 121. In this case said first power meter 121 is adapted to measure electrical power that is transferred through said second primary coil 112 too.

Said device 120 is for example a computer having data interfaces and a processor. Said device 120 comprises a storage, for example to store data and program code that can be executed on said device 120.

Said road infrastructure 100 comprises a road 150 and one or multiple primary coils 101, 112 that are mounted near said road infrastructure 100, e.g. underneath said road 150, such that an electromagnetic field generated by supplying said primary coils 101, 112 with electrical power penetrates an area above said road 150 to the side where vehicles drive. Additionally or alternatively said primary coils 101, 112 may be mounted in a way to allow the electromagnetic field generated near said road infrastructure 100, e.g. in an area above said road 150 where vehicles drive, to penetrate through said primary coils 101, 112. Said primary coils 101, 112 are typically mounted next to each other following the route of the road or a lane of the road 150. Alternatively to mounting them underneath said road 150 said primary coils 101, 112 may be mounted above said road 150 or on the side of the road 150.

To simplify FIG. 1, only two primary coils 101, 112 are depicted. However multiple primary coils not depicted in FIG. 1 may be used.

Said data links 125 may be data bus or network connections, such as Ethernet. Said data links may be part of a local area network (LAN), wireless local area network (WLAN, 802.11n) or wide area network (WAN). Connections via said data links is for example according to the well known internet protocol (IP), user datagram protocol (UDP), transmission control protocol (TCP) or stream control transmission protocol (SCTP). Signaling is for example according to the well known Simple Object Access Protocol (SOAP), Representational State Transfer (REST) or session initiation protocol (SIP) or Internet Protocol Multimedia Subsystem (IMS). Addressing may be done using the well known uniform resource locators (URL), uniform resource identifiers (URI).

The connection can but must not be directly between the devices. In a wide area network multiple intermediate devices may be used.

Said primary coils 101 and 112, said power meters 121 and 122, said device 120, said data links 125 and 127 and said antenna 126 form part of a charging system used to charge moving electrical vehicles while they are passing over said primary coils 101, 112 in a specific section of said road 150 or lane of said road 150.

A vehicle 130, depicted in FIG. 1, comprises a secondary coil 102, a third power meter 132 and a sender 131. Said secondary coil 102 is connected to the on board electric system, e.g. to a battery that is not depicted in FIG. 1, via said third power meter 132.

Said third power meter 132 is adapted to measure power transferred through said secondary coil 102. Said sender 131 is adapted to send information about said power transfer through said secondary coil 102, in particular to said charging system via said antenna 126. Said sender 131 and said antenna 126 are for example adapted to transfer data via a wireless connection for example according to the IEEE 802.11 standard. Alternatively, said data may be transferred by any other means of wireless communication, for example by a Long Term Evolution (well known as LTE) or General Packet Radio Service (well known as GPRS) connection.

Said device 120 is adapted to receive power transmission values from said first power meter 121, said second power meter 122 and said third power meter 132. Furthermore, said device 120 is adapted to determine a first inductive coupling efficiency component $\eta\_ROAD$, attributed to said road infrastructure from a total efficiency $\eta\_TOT$, depending on a second inductive coupling efficiency component $\eta\_GEO$, attributed to a position of said secondary coil 102, relative to said primary coil 101 and of a third inductive coupling efficiency component $\eta\_VEHICLE$, attributed to an electric circuit, comprising said secondary coil 102. Said electric circuit may be said secondary coil 102 and the power lines from said secondary coil 102 to said on board electric system, e.g. said battery.

Said primary coil 101, 112 is mounted near said road infrastructure 100 in a way that an electromagnetic field generated by said primary coil 101, 112 penetrates a predetermined area above said road infrastructure 100. For said vehicle 130 having said secondary coil 102 this means that the construction of the vehicle 130, the road infrastructure 100 and the primary and secondary coils is selected that the predetermined area of the electromagnetic field extends far enough to penetrate said secondary coil 102 at least partially when said vehicle 130 is driving over said road 160.

Furthermore the construction may be selected to allow an electromagnetic field generated by said secondary coil 102 to extend far enough to penetrate said primary coil 101, 112 when said vehicle 130 moves on said road 150. This means that an electromagnetic field generated by one of said primary coil 101, 112 or said secondary coil 102 penetrates the other. Hence electric power may be transferred from said primary coil 101, 112 to said secondary coil 102 or vice versa while said vehicle 130 moves on said road 150.

According to the example, said total efficiency η_TOT and said second inductive coupling efficiency component η_GEO are functions of the relative positions of said secondary coil 102 and said primary coils 101 or 112. Said relative positions are for example described as depicted in FIG. 2, using a Cartesian coordinate system with X and Y axis.

Figure 3:
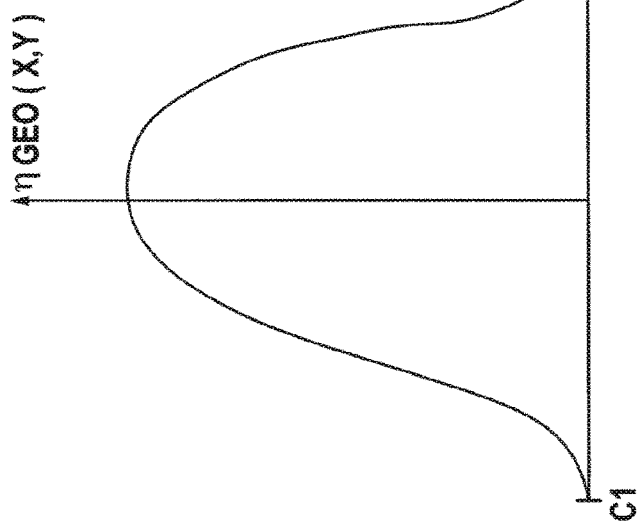
FIG. 3 schematically shows an efficiency diagram.
Figure 2:
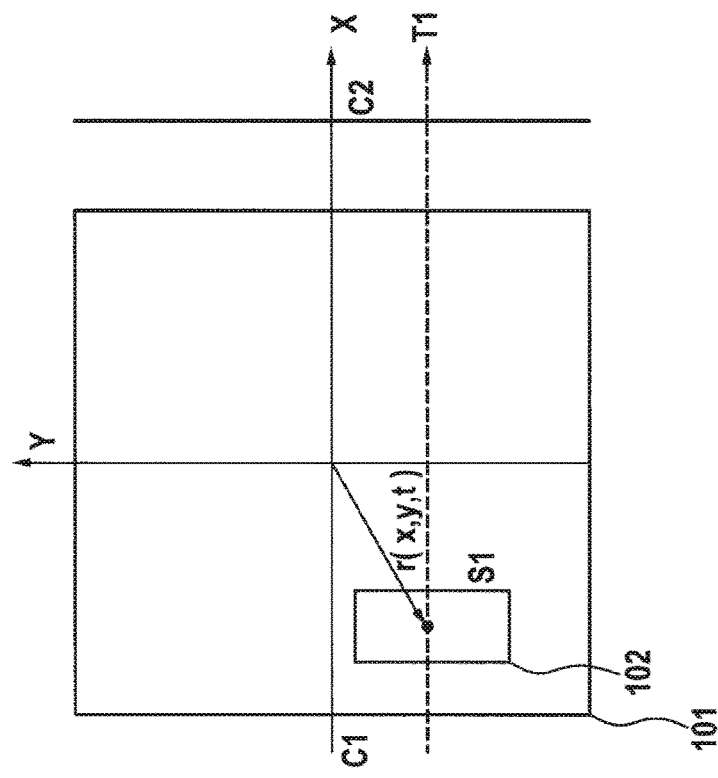
FIG. 2 schematically shows a first diagram of a primary coil and a secondary coil.
Figure 4:
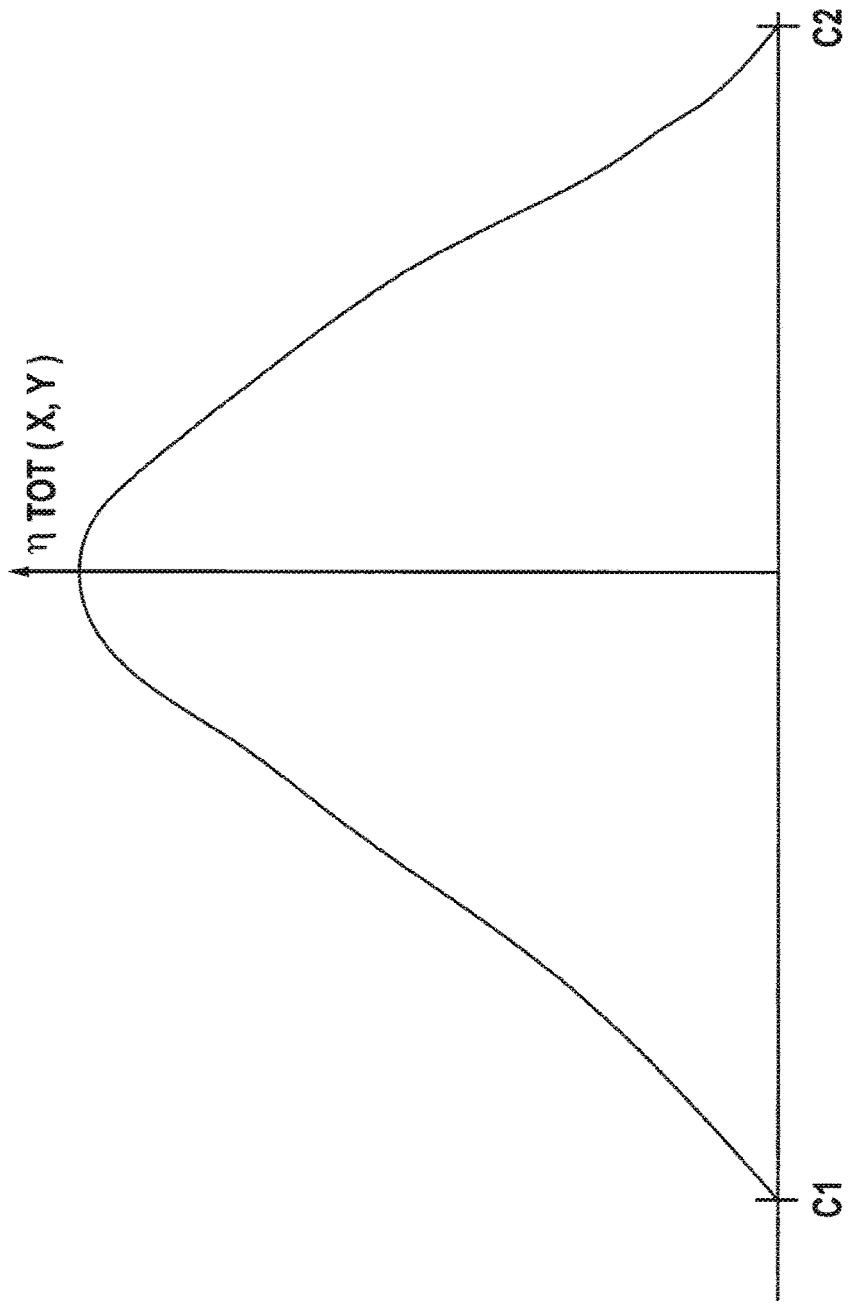
FIG. 4 schematically shows an efficiency diagram.

FIGS. 3 and 4 schematically show the run of the characteristic curves of said second inductive coupling efficiency component η_GEO and said total efficiency η_TOT along the track T1 depicted in FIG. 2 as a dashed arrow.

Due to the fact that the movement of said secondary coil 102 relative to said primary coil 101 influences the position of said secondary coil 102 in said Cartesian coordinate system, individual efficiency values can be determined depending on the time.

As depicted in FIGS. 3 and 4, both efficiency characteristics start at 0, close to the border C1 as that said secondary coil 102 starts overlapping with said primary coil 101 and ends at an efficiency of 0 close to the border C2 as that said secondary coil 102 stops overlapping with said first primary coil 101 during the movement. The secondary coil 102 starts to overlap with the primary coil 101 in the example when the side S1 of the secondary coil 102 is at the position C1 on the x-axis when moving in direction of the trajectory T1. The secondary coil 102 stops to overlap with the primary coil 101 when the side S1 of the secondary coil 102 is at the position C2 on the x-axis when moving in direction of the trajectory T1.

The second inductive coupling efficiency component η_GEO is a function of the position of the secondary coil 102 relative to the primary coil 101 or 112 respectively. Hence the total efficiency η_TOT is also a function of this relative position of the secondary coil 102 relative to the primary coil 101 or 112 respectively.

In the exemplary curves it is assumed as depicted in FIGS. 3 and 4 that the quotient of the total efficiency η_TOT and the second inductive coupling efficiency component η_GEO, attributed to the position of the secondary coil 102 relative to said primary coils 101 and 112, is not varying on short time scale and independent from the position of the secondary coil 102 relative to the primary coil 101 or 112 respectively. This means that for a specific vehicle that the third inductive coupling efficiency component η_VEHICLE remains constant, independent from the position of the vehicle. Furthermore this means that said first inductive coupling efficiency component η_ROAD is time invariant on short time scale for the section of the road 150 in which individual primary coils 101 or 112 are mounted. The value may vary between the road sections of the different primary coils 101 or 112.

According to the example the value η_ROAD is predetermined for the section of said road 150 where said first primary coil 101 is mounted. Said η_ROAD value is stored for example in said device 120 as η_ROAD1. The η_ROAD values for sections of said road 150 at mounting positions of other primary coils are in the example initially unknown and may vary on long time scale, e.g. due to wear out.

Basis for this assumption is that the road 150 and the vehicle 130 are manufactured in a way to provide this short time invariance of efficiency values. The value itself may change over time, e.g. with road wear or age of the vehicle 130.

The total efficiency η_TOT can be factorized as follows:

$$\eta\_TOT = \eta\_ROAD \times \eta\_VEHICLE \times \eta\_GEO.$$

Instead of describing the relative positions of said secondary coil 102 and said primary coil 101, using a Cartesian coordinate system, the misalignment of the coils may be described using vector description. For example a vector r from the origin of the Cartesian coordinate system to the center of the secondary coil 102 may be used to describe the position as depicted in FIG. 2. For example said vector r is described as a function of the position of the center of said secondary coil 102 in terms of x-axis, y-axis and time:

$$r = (x, y, t).$$

Preferably, said second inductive coupling efficiency component η_GEO is determined once for all relative positions of said secondary coil 102 relative to said primary coils 101 and 112 and stored on said device 120.

Alternatively, characteristic curves may be extrapolated or interpolated using discrete sample values at which said second inductive coupling efficiency component η_GEO is determined and stored in said device 120. To that end, for example the geometry of said primary coils 101, 112, and said secondary coil 102 is known, e.g. a rectangular shape with predetermined side length in centimeters. Said geometry of said second coil 102 may be transferred from said sender 131 to said device 120 or said device 120 may be adapted to look up said geometry information from information about said vehicle 131, transmitted to said device 120 by said sender 131.

A method for determining information about efficiency of said inductive charging system is described below, making reference to FIG. 5. The method is explained using said first primary coil 101 and said second primary coil 112. Said method applies likewise to all other primary coils of a certain section of said road 150. Said method starts for example when an electromagnetic field generated by one of said first primary coil (101) or said secondary coil (102) penetrates the other coil, e.g. said secondary coil 102 is detected to start to overlap with said first primary coil 101 at least partially. The detection may be based on information from a reader for radio frequency identification devices (well known as RFID), e.g. an RFID tag, that contains the information and was previously attached to said vehicle 130. Alternatively the detection may be based on information from said third power meter 132 indicating the start of the penetration of the electromagnetic field.

After the start, a step 501 is executed.

In said step 501, information about the power transferred through said first primary coil 101 is determined. For example a first power measurement P1 is determined by said device 120 from meter readings of said first power meter 121. Afterwards a step 502 is executed.

In said step 502 a test is performed to determine whether information about the power transfer through said secondary coil 102 has been received. For example a test is performed to determine whether a second power value P2 has been received from said sender 131. In case information about the power transfer has been received a step 503 is executed. Otherwise a step 500 is executed.

In said Step 500 a timeout condition is monitored. In case said timeout condition is met, said method ends. Alternatively to ending the method, in case of a failure to receive said second power value P2 a default value or a replacement value may be read from storage and used to continue with said method at the next primary coil. Otherwise said step 502 is executed.

In said step 503 said total efficiency $\eta\_TOT$ is determined. For example said total efficiency $\eta\_TOT$ is determined according to the following formula:

$$\eta\_TOT(t)=P2(T) \div P1(t).$$

The current time t may be used in order to distinguish between power values measured at different times. Additionally or alternatively, the current time t may be used to ensure that power values measured at essentially the same time are used to calculate total efficiency $\eta\_TOT$. This improves robustness and reliability of the inventive method. Said values $\eta\_TOT$ (t) are stored in storage for further processing. Afterwards a step 504 is executed.

In said step 504 a test is performed to determine if enough values of $\eta\_TOT$ (t) have been calculated in order to determine the shape of the characteristic of the total efficiency $\eta\_TOT$ to an extent efficient to identify the second inductive coupling efficiency component $\eta\_GEO$. Enough values are determined for example if more than a predetermined number of values $\eta\_TOT$ (t) are stored. Said predetermined number of values $\eta\_TOT$ (t) is for example 10. Alternatively, the number of values $\eta\_TOT$ (t) required may be dynamically adjusted depending on the result of a matching of shapes of a characteristic curve said total efficiency $\eta\_TOT$, e.g. as depicted in FIG. 4 and a family of previously stored characteristic curves of said second inductive coupling efficiencies component $\eta\_GEO$.

As described before, the quotient from the stored characteristics for said second inductive coupling efficiency component $\eta\_GEO$ and said total efficiency $\eta\_TOT$ is a short time invariant value, therefore allowing for identification of the matching second inductive coupling efficiency component $\eta\_GEO$ from the values stored. Enough values of the total efficiency $\eta\_TOT$ are sampled as soon as only a single characteristic $\eta\_GEO$ is found. For example a least square algorithm may be used to judge the similarity between said total efficiency values measured and said second inductive coupling efficiency component $\eta\_GEO$. In case enough values for $\eta\_TOT$ (t) have been determined, said second indicative coupling efficiency component $\eta\_GEO$ is determined and afterwards a step 505 is executed. Otherwise, said step 501 is executed.

In said step 505, said third inductive coupling efficiency component $\eta\_VEHICLE$ is determined. For example, said third inductive coupling efficiency component $\eta\_VEHICLE$ is determined as follows:

$$\eta\_VEHICLE=\eta\_TOT(t) \div (\eta\_GEO \times \eta\_ROAD).$$

In this equation, $\eta\_ROAD$ is known for said first primary coil from storage in said device 120. This way, said first inductive coupling efficiency component $\eta\_ROAD$ at the location of said first primary coil 101 in said charging system is used to determine the previously unknown efficiency component of said vehicle 130, namely said third inductive coupling efficiency component $\eta\_VEHICLE$.

Optionally said third inductive coupling efficiency component $\eta\_VEHICLE$ may be stored in storage assigned to a vehicle identifier. According to this option, in an extension of this method, the current value may be compared to previously stored values of the same vehicle, in order to correct a false measurement or detect degradation or wear in the vehicles charging system.

To that end optionally available previously stored values of said third inductive coupling efficiency component $\eta\_VEHICLE$ may be read from storage and compared to the current value. If the difference exceeds a certain predetermined threshold optionally the average value of previously stored values or the latest of said previously stored values of said third inductive coupling efficiency component $\eta\_VEHICLE$ are used instead of the current value. Additionally information about the difference, e.g. a status report may be sent to the vehicle 130 or a central management center, e.g. as a text message.

Afterwards a step 506 is executed.

In said step 506 a test is performed to determine whether said vehicle 130 has moved to said second primary coil 112. For example a test is performed to determine whether said secondary coil 102 overlaps at least partially with said second primary coil 112. For example said RFID reader information is used to determine the position of said vehicle 130.

In case said secondary coil 102 overlaps at least partially with said second primary coil 112, a step 507 is executed. Otherwise, a step 508 is executed.

In said step 508, a timeout condition is monitored. In case said timeout condition is met it is considered that said vehicle 130 will not pass over this primary coil and the method ends. Alternatively said method continues at the next available primary coil. Otherwise said step 506 is executed.

In said step 507 a value of power transferred through said second primary coil 112 is determined for example by said device 120 from meter readings of said second power meter 122. For example said power transfer value P1 (t) is determined as described in step 503.

Afterwards a step 509 is executed.

In said step 509 a test is performed to determine whether information about the power transfer through said secondary coil 102 has been received. Said test is for example performed equivalent to the test described in said step 502.

In case information about power transfer through said secondary coil 102 has been received, a step 510 is executed. Otherwise, a step 511 is executed.

In said step 511 a timeout condition is monitored. In case the timeout condition is met, said method ends. Alternatively said method continues at the next available primary coil. Otherwise said step 509 is executed In said step 510 the total efficiency $\eta\_TOT$ (t) is determined, for example as described in said step 503.

Afterwards, a step 512 is executed.

In said Step 512, it is determined if enough values of said total efficiency $\eta\_TOT$ (t) are available to determine said second inductive efficiency component $\eta\_GEO$.

Said test is for example performed equivalent to the test described in test 504. In case enough values are available, a step 513 is executed. Otherwise step 507 is executed.

In said step 513, said first inductive coupling efficiency component $\eta\_ROAD$ is determined, for example according to the following equation.

$$\eta\_ROAD=\eta\_TOT(\eta\_GEO \times \eta\_VEHICLE).$$

Afterwards said method ends. Alternatively said method continues for the next available primary coil or ends when the last primary coil of the road 150 has been processed.

Additionally or optionally, said determined values may be stored on the storage of said device 120 for future use. Preferably said $\eta\_ROAD$ values are assigned in a database to the position of the respective primary coils 101, 112 to be used for further calculations.

Said method may be repeated for multiple vehicles. In this case, each of the determined values may be assigned a unique vehicle identifier or a random number in order to distinguish the data sets determined from individual vehicles. Furthermore, the efficiency terms calculated from individual vehicles may be used to refine the first inductive coupling efficiency values $\eta\_ROAD$ for the individual sections of said charging system, for example by averaging the values. Afterwards, new values of said first inductive coupling efficiency may be stored instead of the previous calculated values. Storage may be mapped to vehicle types instead of individual vehicles. The vehicles of the same make and type may comprise the same components and have the same efficiency component $\eta\_VEHICLE$. This way the required information is available without tracking individual vehicles or storing excessive data.

Optionally, the calculated value of said third inductive coupling efficiency component $\eta\_VEHICLE$ may be sent to said vehicle 130, for example via said wireless data link. In this case, said vehicle comprises a receiver adapted to receive said information. Furthermore, error reduction or failure detection may be performed by averaging measurements of many coils crossed by a number of vehicles. The refined measurement values may hence be transmitted back to the vehicles in order to allow mutual updating the final actual vehicle efficiency value component $\eta\_VEHICLE$.

An exemplary way of storing said information is given in the table below:

| Vehicle type identifier | Primary Coil Number | | |
|---|---|---|---|
| | 1 | 2 | ... |
| 1 | $\eta\_ROAD1$, $\eta\_VEHICLE1*$ | $\eta\_ROAD2*$, $\eta\_VEHICLE1**$ | ... |
| 2 | $\eta\_ROAD1$, $\eta\_VEHICLE2*$ | $\eta\_ROAD2**$, $\eta\_VEHICLE2**$ | ... |
| ... | ... | ... | ... |

The first inductive coupling efficiency component $\eta\_ROAD1$ of the first primary coil 1 is known and already stored in said data base. The third inductive coupling efficiency components $\eta\_VEHICLE1$, $\eta\_VEHICLE2$, $\eta\_VEHICLE3$, ... of the individual vehicles is determined and stored for each vehicle in a first iteration from the first inductive coupling efficiency component $\eta\_ROAD1$ at the position of first primary coil 101. The calculation is then repeated multiple times for each of the coils. The resulting third inductive coupling efficiency components $\eta\_VEHICLE1$, $\eta\_VEHICLE2$, $\eta\_VEHICLE3$, ... are stored indexed in the table with one additional asterisk (*) per iteration. The $\eta\_ROAD$ and $\eta\_VEHICLE$ values are calculated for example according to the following example.

First Iteration:

Calculated third inductive coupling efficiency component of first vehicle type $$\eta\_VEHICLE1* = \eta\_TOT1 \div (\eta\_GEO1 \times ROAD1)$$

where $\eta\_TOT1$ and $\eta\_GEO1$ are determined while vehicle 1 is passing the first primary coil 101.

Calculated first inductive coupling efficiency component of the second primary coil 112

$$\eta\_ROAD2* = \eta\_TOT2 \div (\eta\_GEO2 \times \eta\_VEHICLE1*)$$

where $\eta\_TOT2$ and $\eta\_GEO2$ are determined while vehicle 1 is passing the second primary coil 112.

Calculated third inductive coupling efficiency component of second vehicle type $$\eta\_VEHICLE2* = \eta\_TOT1 \div (\eta\_GEO1 \times ROAD1)$$

where $\eta\_TOT1$ and $\eta\_GEO1$ are determined while vehicle 2 is passing the first primary coil 101.

Second Iteration:

Calculated first inductive coupling efficiency component of the second primary coil 112

$$\eta\_ROAD2** = (\eta\_TOT2 \div (\eta\_GEO2 \times \eta\_VEHICLE2*) + \eta\_ROAD2*) \div 2$$

where $\eta\_TOT2$ and $\eta\_GEO2$ are determined while vehicle 2 is passing the second primary coil 112.

Calculated third inductive coupling efficiency component of first vehicle type $$\eta\_VEHICLE1** = (\eta\_VEHICLE1* + \eta\_TOT2 (\eta\_GEO2 \times \eta\_ROAD2)) \div 2$$

where $\eta\_TOT2$ and $\eta\_GEO2$ are determined while vehicle 1 is passing the second primary coil 112.

Any other ways of determining aforementioned values iteratively may apply. For example the third inductive coupling efficiency component $\eta\_VEHICLE$ may be determined once for each vehicle passing said first primary coil 101. In this case the first inductive coupling efficiency component $\eta\_ROAD$ may be determined iteratively for the second primary coil 112 from multiple vehicles passing said second primary coil 112 as moving average value over all vehicles passing over said second primary coil 112.

Additionally failure detection may be performed in an additional step of said method. To that end the repetitive determination of abnormal primary coil efficiency components $\eta\_ROAD$ severely and consistently deviating from the average value by a high number of vehicles might indicate degradation or failure of this coil element in the road. This information may be communicated to a system operator via a graphical user interface or other communication means, like a message sent to a monitoring server connected via a data link to said device 120 (both, data link and monitoring server not depicted in FIG. 1).

On the other hand repetitive detection of vehicle efficiency component $\eta\_VEHICLE$ by a high number of charging coils might indicate failure of charging system on the vehicle side. This information may be communicated to a system operator or the vehicle driver via a graphical user interface or other communication means, like a message sent to a display unit in said vehicle 130 connected via said data link to said device 120.

In both cases said additional step comprises of determining an average value of the respective efficiency component. Furthermore for each of the calculated efficiency component values a test is performed whether it deviates from the average value by more than a predetermined threshold. If so, a message, e.g. "Failure of Coil", is either displayed on said graphical user interface or send to the respective monitoring center or display unit. Alternatively said predetermined threshold may directly be used to determine whether the currently calculated efficiency component value deviates too much. In that case, the vehicle type or coil type may be used to determine the threshold.

In any case the predetermined threshold is for example stored in said device 120.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled as 'processor', may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term 'processor' should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts and the like represent various processes which may be substantially represented in computer readable medium and so executed by a computer or processor, whether or not such computer or processor is explicitly shown.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The invention claimed is:

1. A method for determining information about an efficiency of an inductive charging system, comprising:

receiving an output from one or more devices that measure power transferred through one or more primary coils embedded in a road infrastructure;

receiving, from a vehicle moving on said road infrastructure, an output from another device that measures power transferred through a secondary coil located in said vehicle; and determining a first inductive coupling efficiency component attributed to said road infrastructure from a total efficiency based on a second inductive coupling efficiency component attributed to a position of said secondary coil relative to said one or more primary coils and of a third inductive coupling efficiency component attributed to an electric circuit comprising said secondary coil.

2. The method according to claim 1, wherein said one or more primary coils comprise a first primary coil, and wherein said third inductive coupling efficiency component is determined from a first value of said total efficiency determined when an electromagnetic field generated by one of said first primary coil or said secondary coil penetrates the other coil at least partially, and a predetermined first value of said first inductive coupling efficiency component attributed to said road infrastructure at a location of said first primary coil.

3. The method according to claim 2, wherein said one or more primary coils comprise a second primary coil, and wherein a second value of said first inductive coupling efficiency component attributed to said road infrastructure at the location of said first primary coil is determined from a second value of said total efficiency determined when an electromagnetic field generated by one of said second primary coil or said secondary coil penetrates the other coil at least partially.

4. The method according to claim 2, further comprising:
determining said second inductive coupling efficiency component from the geometry of said first primary coil as a function of a position of said secondary coil relative to a location of said one or more primary coils;
storing at least one pair of values of location and respective second inductive coupling efficiency component in a characteristic curve; and
determining said second inductive coupling efficiency component from storage by extrapolation or interpolation of said pair of values of said characteristic curve.

5. The method according to claim 1, further comprising determining said total efficiency based on measured information about a first power transfer through said one or more primary coils and measured information about a second power transfer through said secondary coil.

6. The method according to claim 5, wherein said measured information is determined from measurements taken at essentially a same time.

7. The method according to claim 1, further comprising:
determining at least two values of said total efficiency while said secondary coil is passing a trajectory over said one or more primary coils when movement of said secondary coil relative to said one or more primary coils is detected; and
determining said second inductive coupling efficiency component based on said at least two values of said total efficiency.

8. The method according to claim 1, wherein said one or more primary coils are mounted near said road infrastructure in a way that an electromagnetic field generated by said one or more primary coils penetrates a predetermined area above said road infrastructure.

9. A device for determining information about an efficiency of an inductive charging system, said device being adapted to:
- receive an output from one or more devices adapted to measure power transferred through one or more primary coils embedded in a road infrastructure;
- receive, from a vehicle moving on said road infrastructure, an output from another device that measures power transferred through a secondary coil located in said vehicle; and
- determine a first inductive coupling efficiency component attributed to said road infrastructure from a total efficiency based on a second inductive coupling efficiency component attributed to a position of said secondary coil relative to said primary coil and of a third inductive coupling efficiency component attributed to an electric circuit comprising said secondary coil.

10. A system for determining information about an efficiency of an inductive charging system, comprising:
- a primary coil embedded in a road infrastructure;
- a first power meter connected to said primary coil, said first power meter being adapted to measure electrical power transferred through said primary coil;
- a secondary coil located in a vehicle moving on said road infrastructure;
- a second power meter connected to said secondary coil, said second power meter being adapted to measure electrical power transferred through said secondary coil; and
- a device adapted to receive an output from said first power meter and receive an output from said second power meter sent from said vehicle to determine a first inductive coupling efficiency component attributed to said road infrastructure from a total efficiency based on a second inductive coupling efficiency component attributed to a position of said secondary coil relative to said primary coil and of a third inductive coupling efficiency component attributed to an electric circuit comprising said secondary coil.

11. A non-transitory computer-readable medium storing computer executable instructions for determining information about an efficiency of an inductive charging system, comprising:
- receiving an output from a first device that measures power transferred through a primary coil embedded in a road infrastructure;
- receiving, from a vehicle moving on said road infrastructure, an output from a second device that measures power transferred through a secondary coil located in said vehicle; and
- determining a first inductive coupling efficiency component attributed to said road infrastructure from a total efficiency based on a second inductive coupling efficiency component attributed to a position of said secondary coil relative to said primary coil and of a third inductive coupling efficiency component attributed to an electric circuit comprising said secondary coil.

* * * * *